US010965091B2

(12) United States Patent
Waterbury et al.

(10) Patent No.: US 10,965,091 B2
(45) Date of Patent: Mar. 30, 2021

(54) UV LASERS AND UV RAMAN SYSTEMS FOR EFFECTIVE AND EFFICIENT MOLECULAR SPECIES IDENTIFICATION WITH RAMAN SPECTROSCOPY

(71) Applicant: Alakai Defense Systems, Inc., Largo, FL (US)

(72) Inventors: Robert Douglas Waterbury, Palm Harbor, FL (US); Darius Vunck, Clearwater, FL (US); Robert Dean Babnick, Largo, FL (US); Timothy Molner, St. Petersburg, FL (US); Hunter Hardy, Pinellas Park, FL (US); Ed Dottery, Palm Harbor, FL (US); Robert McKinney, Winter Park, FL (US); David Welford, Danvers, MA (US)

(73) Assignee: Alakai Defense Systems, Inc., Largo, FL (US)

( * ) Notice: Subject to any disclaimer, the term of this patent is extended or adjusted under 35 U.S.C. 154(b) by 0 days.

(21) Appl. No.: 16/153,261

(22) Filed: Oct. 5, 2018

(65) Prior Publication Data
US 2019/0109431 A1 Apr. 11, 2019

Related U.S. Application Data

(60) Provisional application No. 62/568,892, filed on Oct. 6, 2017.

(51) Int. Cl.
*H01S 3/109* (2006.01)
*H01S 3/16* (2006.01)
(Continued)

(52) U.S. Cl.
CPC .............. *H01S 3/109* (2013.01); *G01J 3/021* (2013.01); *G01J 3/0208* (2013.01);
(Continued)

(58) Field of Classification Search
CPC .. H01S 3/109; H01S 3/094084; H01S 3/1613; H01S 3/1643; H01S 3/0941;
(Continued)

(56) References Cited

U.S. PATENT DOCUMENTS 5,199,042 A 3/1993 Papetti et al.
5,249,190 A * 9/1993 Kortz ..................... H01S 3/109
359/328
(Continued)

OTHER PUBLICATIONS

Metz et al., "Continuous-Wave Pr3+:BaY2F8 and Pr3+:LiYF4 lasers in the cyan-blue spectral region", Optics Letters, vol. 39, No. 17, pp. 5158-5161, Sep. 1, 2014. (Year: 2014).*
(Continued)

*Primary Examiner* — Xinning (Tom) Niu
(74) *Attorney, Agent, or Firm* — McKee, Voorhees & Sease, PLC

(57) ABSTRACT

The present invention relates to a novel stand-off distance chemical detector system such as can be used, for example, for standoff detection of explosives. Instead of a conventional lasing medium, a Pr:YAG or Pr:BYF based UV laser is used which can be advantageously implemented in Raman spectroscopy.

30 Claims, 10 Drawing Sheets

(51) Int. Cl.
*H01S 3/0941* (2006.01)
*G01J 3/10* (2006.01)
*G01J 3/44* (2006.01)
*H01S 3/08* (2006.01)
*G01J 3/02* (2006.01)
*H01S 3/094* (2006.01)
*H01S 3/042* (2006.01)
*H01S 3/04* (2006.01)
*H01S 5/323* (2006.01)
*H01S 3/081* (2006.01)

(52) U.S. Cl.
CPC .......... *G01J 3/0248* (2013.01); *G01J 3/0272* (2013.01); *G01J 3/10* (2013.01); *G01J 3/44* (2013.01); *H01S 3/08059* (2013.01); *H01S 3/0941* (2013.01); *H01S 3/094084* (2013.01); *H01S 3/1613* (2013.01); *H01S 3/1643* (2013.01); *H01S 3/042* (2013.01); *H01S 3/0405* (2013.01); *H01S 3/0815* (2013.01); *H01S 3/08054* (2013.01); *H01S 3/09415* (2013.01); *H01S 3/1646* (2013.01); *H01S 3/1653* (2013.01); *H01S 5/32341* (2013.01)

(58) Field of Classification Search
CPC ............. H01S 3/08059; H01S 5/32341; H01S 3/0815; H01S 3/1653; H01S 3/09415; H01S 3/1646; H01S 3/042; H01S 3/0405; H01S 3/08054; G01J 3/021; G01J 3/0208; G01J 3/0272; G01J 3/0248; G01J 3/10; G01J 3/44
See application file for complete search history.

(56) References Cited

U.S. PATENT DOCUMENTS

| | | | |
|---|---|---|---|
| 5,263,038 A * | 11/1993 | Lukas | H01S 3/042 359/328 |
| 5,309,452 A | 5/1994 | Ohishi et al. | |
| 5,317,585 A | 5/1994 | Gregor | |
| 5,446,749 A | 8/1995 | Nighan et al. | |
| 6,327,281 B1 | 12/2001 | Yin | |
| 7,123,416 B1 | 10/2006 | Erdogan et al. | |
| 8,125,627 B2 | 2/2012 | Dottery et al. | |
| 2007/0091949 A1* | 4/2007 | Adachi | H01S 3/16 372/39 |
| 2007/0279627 A1* | 12/2007 | Tack | G01J 1/42 356/301 |
| 2008/0069156 A1 | 3/2008 | Kasamatsu | |
| 2013/0293882 A1 | 11/2013 | Dottery et al. | |

OTHER PUBLICATIONS

International Search Report and Written Opinion regarding PCT/US2018/054666, 16 pages, dated Nov. 29, 2019.

Metz et al., "Continuous-Wave Pr3+:BaY2F8 and Pr3+:LiYF4 lasers in the cyan-blue spectral region", Optics Letters, vol. 39, No. 17, pp. 5158-5161, Sep. 1, 2014.

Richter et al., "Continuous-wave ultraviolet generation at 320 nm by intracavity frequency doubling of red-emitting Praseodymium lasers", Optics Express, vol. 14, No. 8, 6 pages, Apr. 17, 2006.

Waterbury et al., "Recent Development of Two New UV Raman Standoff Explosive Detection Systems", Proc. of SPIE, vol. 9824, 6 pages, 2016.

Goyal, Akanksha, "Blue Diode Pumped Pr: YLF Laser", ALKAAD Photonics, Teaching and Operation Manual, Dec. 26, 2014, 4 pages.

Liu, et al., Growth and Spectral Properties of Pr3+-doped Y3Al5O12 Crystal for Potential use in All-solidstate Visible Laser, Materials Research Innovations, 2017, vol. 21, No. 2, 5 pages.

Ostroumov, et al, "522/261 NM CW Generation of Pr: YLF Laser Pumped by OPS Laser", 2007, downloaded from http://proceedings.speidigitallibrary.org/ on Sep. 23, 2016, 4 pages.

* cited by examiner

Figure 1:
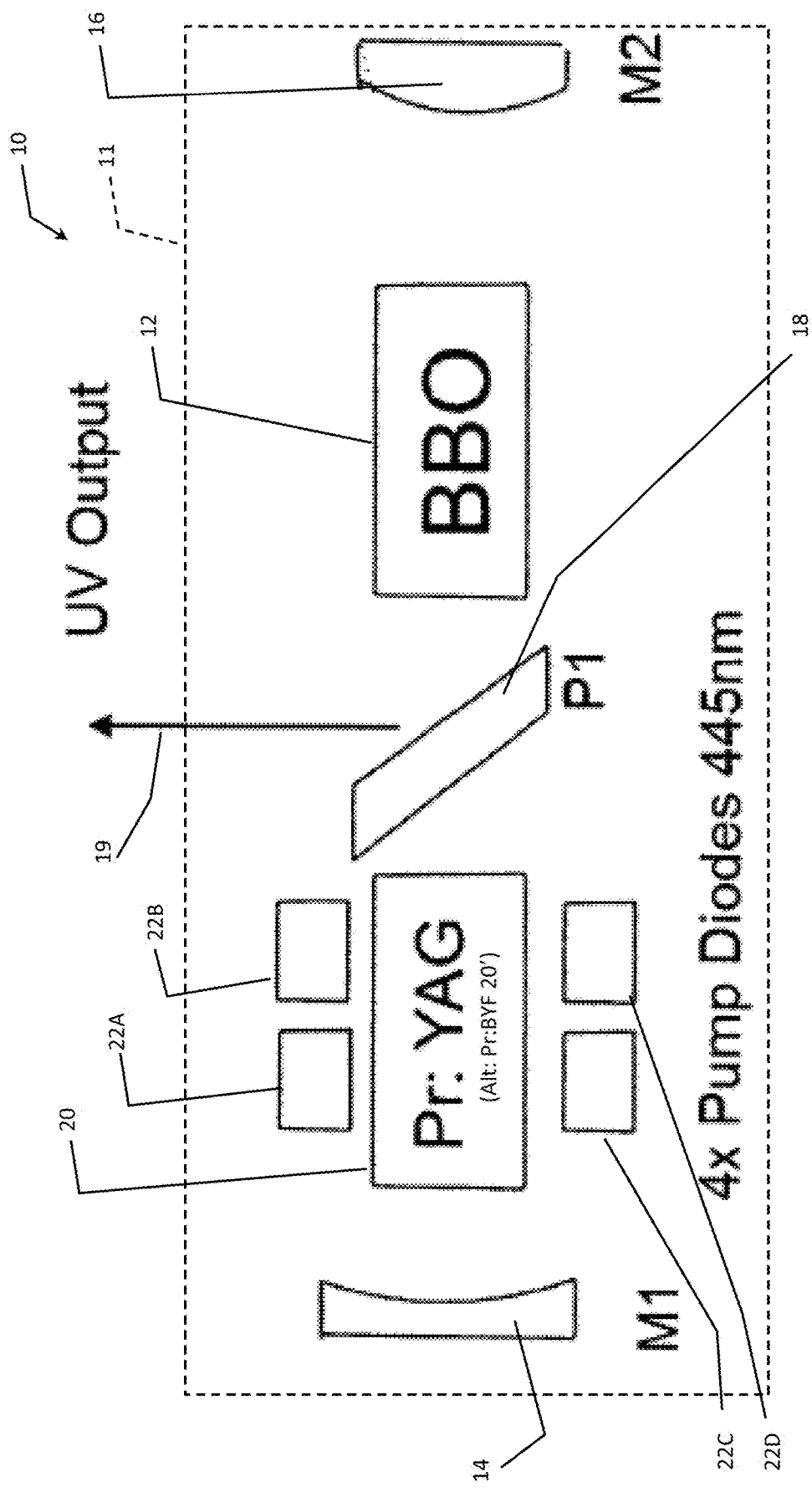

Fig 1. Pr:YAG Laser design - Concave-convex resonator

Figure 2:
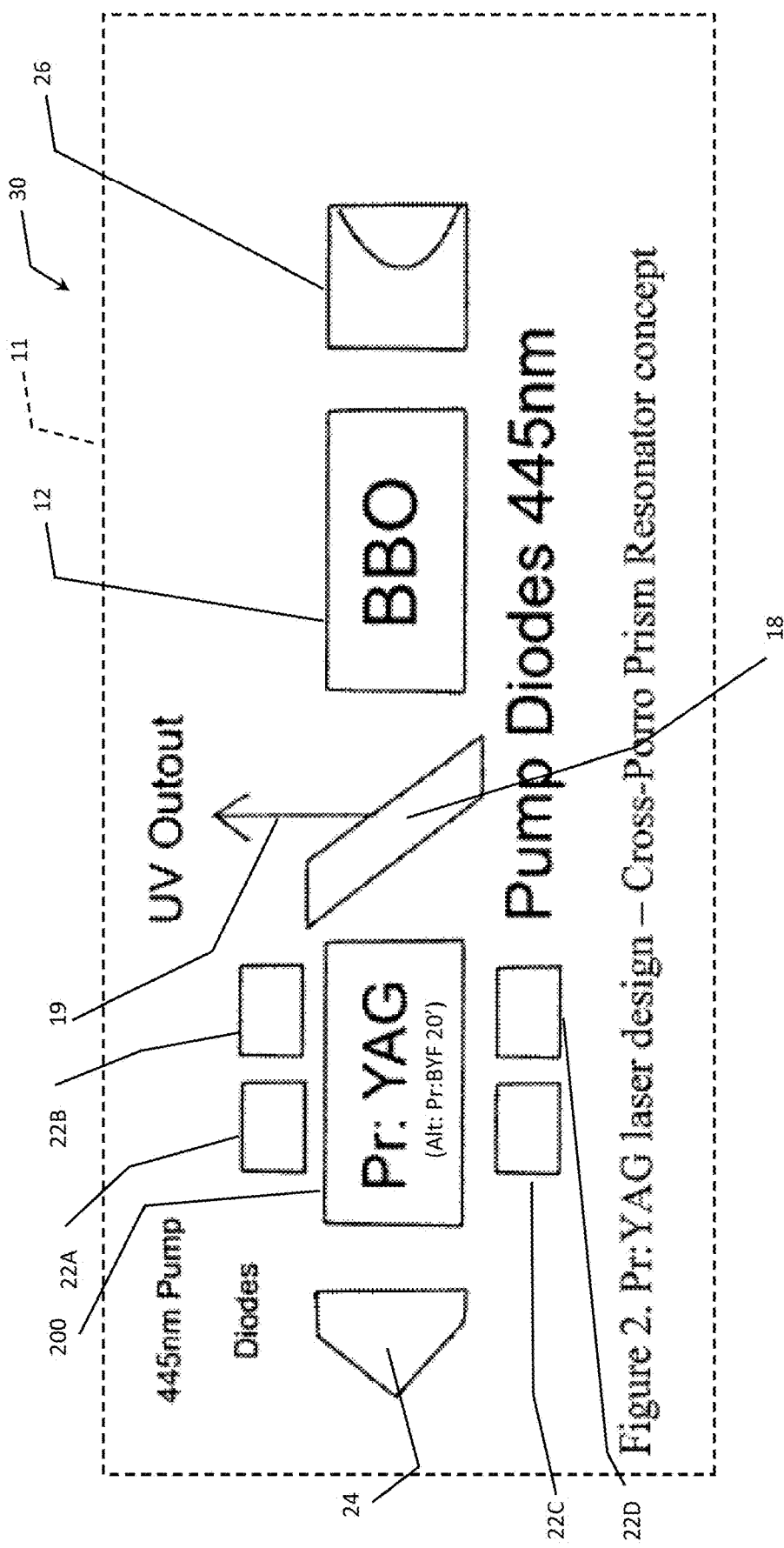

Figure 2. Pr:YAG laser design – Cross-Porro Prism Resonator concept

Figure 4:
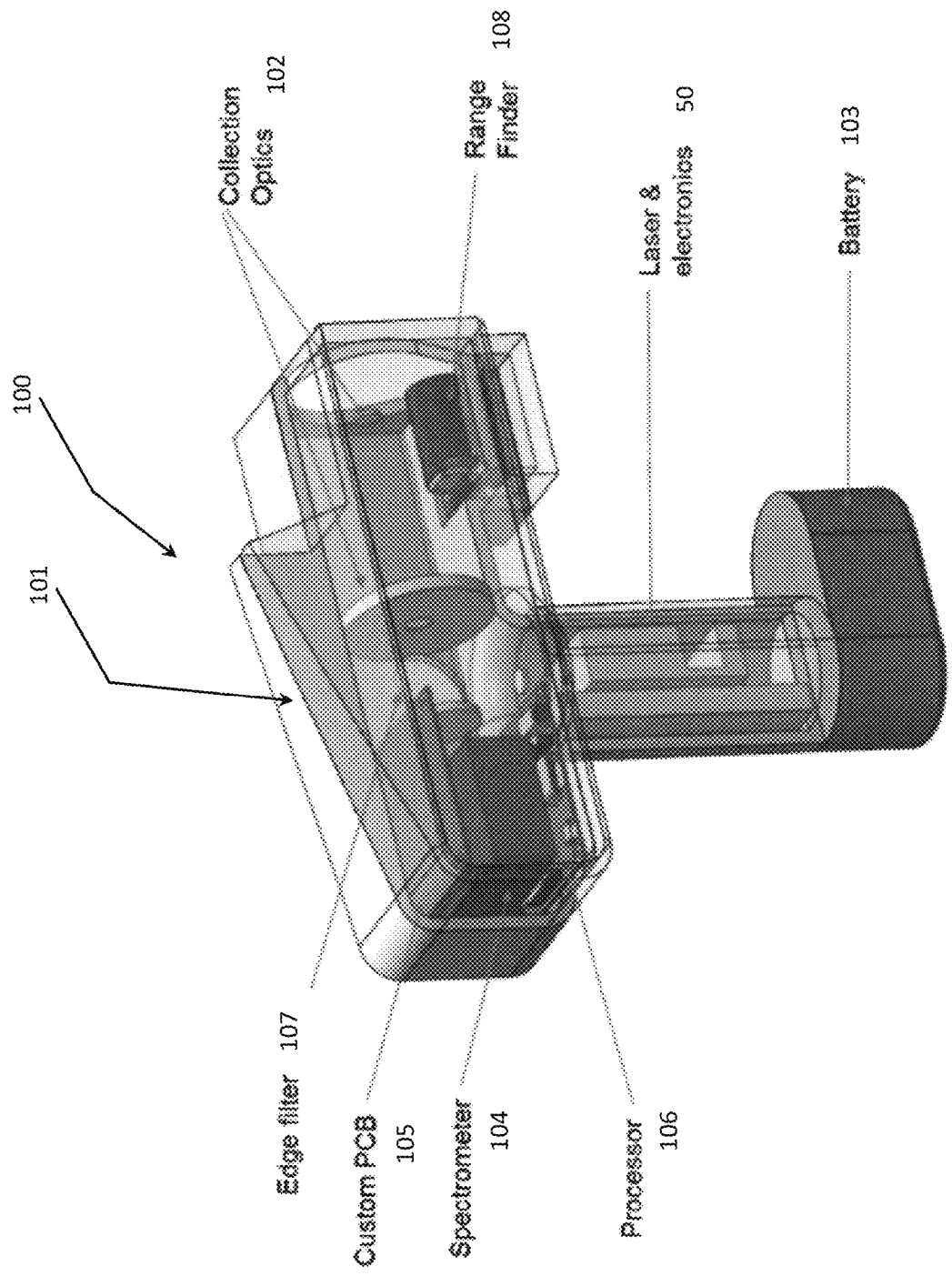

Six Laser Pump Diode Geometry--Double Pass--Axial Concentration
Conductive Sapphire Heat Sink Figure 4. Embodiment of a portable UV Raman system utilize the 244nm Pr:YAG laser. Size of system is ~8"x8"x3".

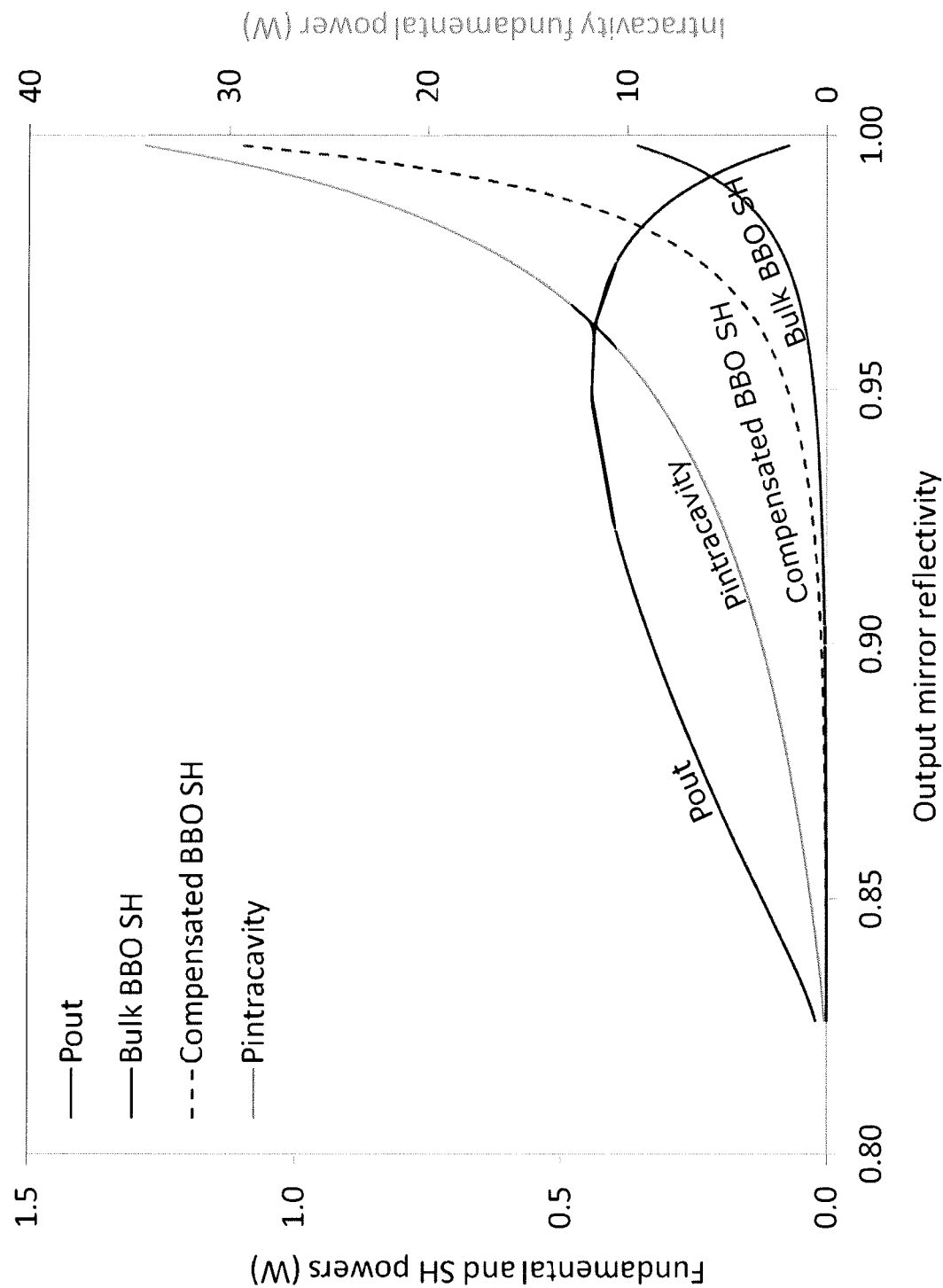
Figure 6. Fundamental (495nm) and SH (247.5nm) power data for a 3-W pumped 495-nm Pr:BYF laser as a function of output mirror reflectivity for a resonator with 2% round trip passive loss.

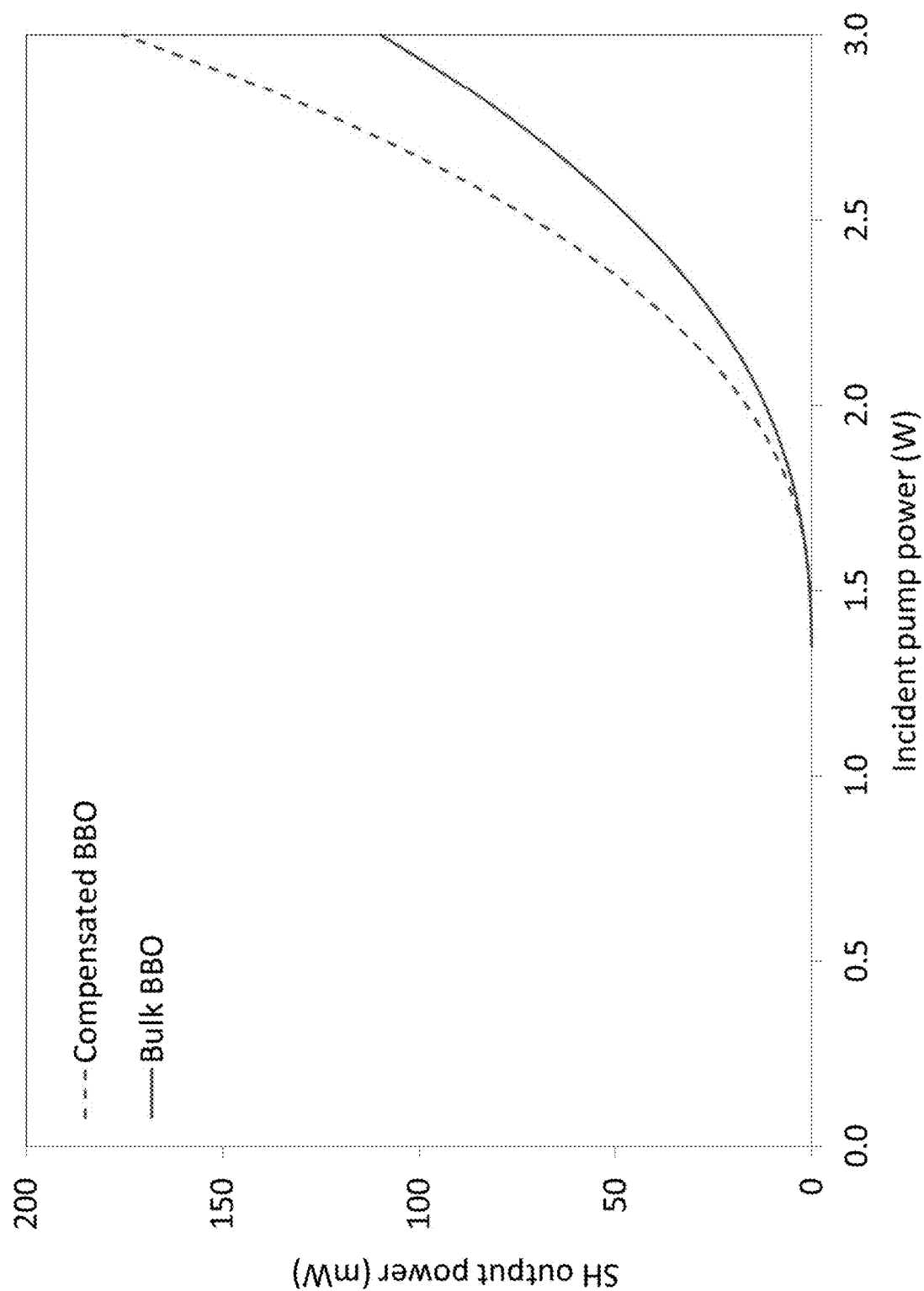
Figure 7. SH output power (247nm) data for a 495-nm Pr:BYF laser.

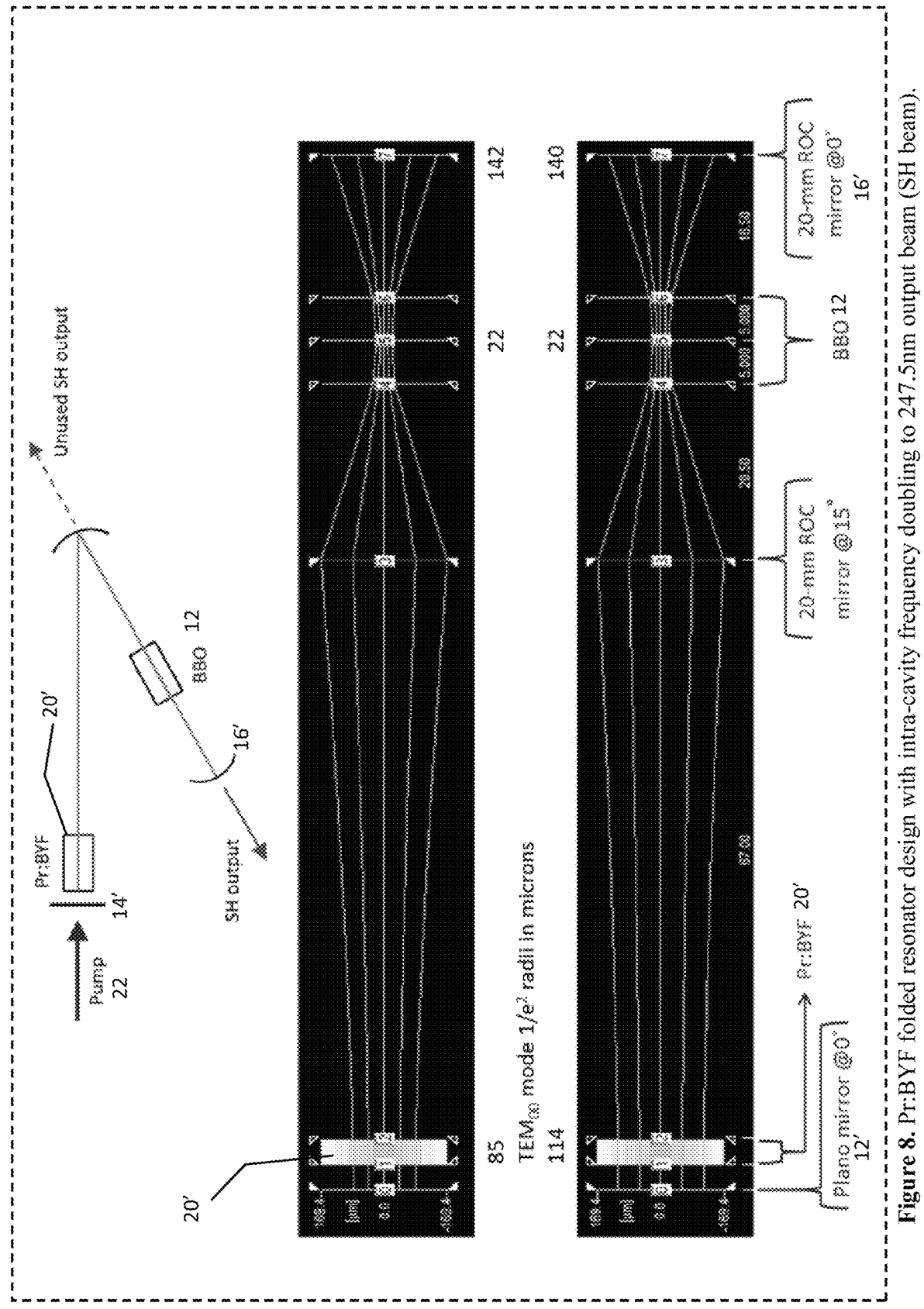
Figure 8. Pr:BYF folded resonator design with intra-cavity frequency doubling to 247.5nm output beam (SH beam).

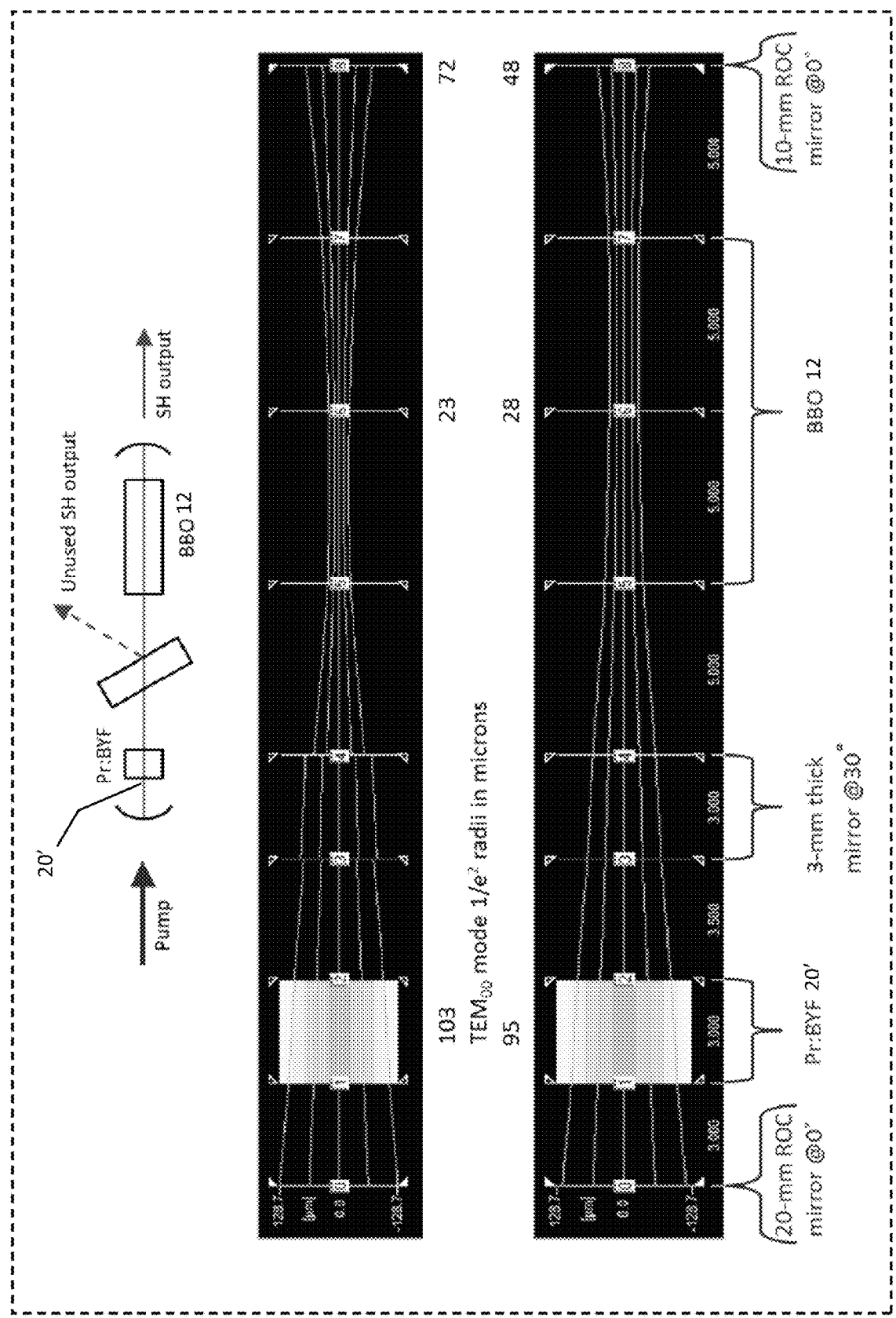
Figure 9. Pr:BYF linear resonator design with intra-cavity frequency doubling to 247.5nm output beam (SH beam).

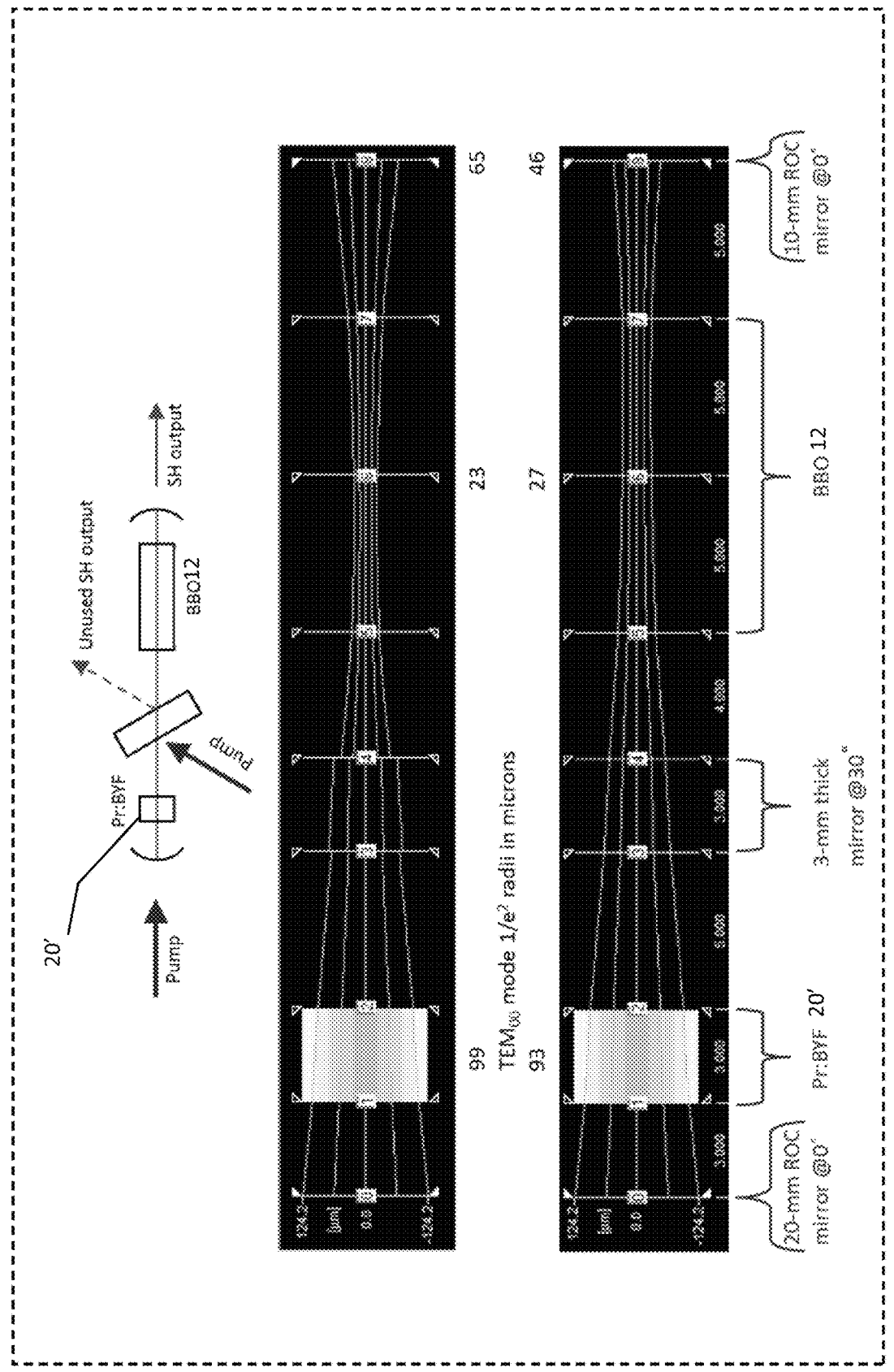
Figure 10. Pr:BYF folded resonator design with two pump laser diodes and intra-cavity frequency doubling to 247.5nm output beam (SH beam).

UV LASERS AND UV RAMAN SYSTEMS FOR EFFECTIVE AND EFFICIENT MOLECULAR SPECIES IDENTIFICATION WITH RAMAN SPECTROSCOPY

CROSS-REFERENCE TO RELATED APPLICATIONS

This application claims the benefit of Provisional Application U.S. Ser. No. 62/568,892 filed on Oct. 6, 2017, all of which is herein incorporated by reference in its entirety.

I. BACKGROUND OF THE INVENTION

A. Field of the Invention

The present invention relates to methods and systems relating to the design of new UV laser/UV Raman system combinations.

B. Problems in the State of the Art

1. Background a. UV Laser—Pr:YAG@244 nm and Praseodymium YAG Solid State Material Characteristics A recently developed laser concept incorporates Praseodymium ("Pr") as the active laser ion which can be doped into a number of crystal host materials. The Praseodymium laser is one of the very few laser sources which is capable of directly producing outputs in the visible wavelength spectrum. Initially this material was investigated with great interest for the production of three color laser displays. However, subsequent rapid development of high power direct laser diodes in the visible spectrum reduced the need for such solid state lasers. Thus, much of the active research declined.

More recent developments in low cost, high power blue laser diode pump sources and the need for UV laser sources has brought renewed attention to Praseodymium doped lasers.

The Praseodymium ion has a complex energy structure within the host crystal. Multiple energy transitions are possible which are capable of producing various visible wavelengths from the deep blue to the dark red with green and yellow lines between. Most efforts at producing UV through intra-cavity frequency doubling have employed the green 522 nm fundamental transition which results in a UV wavelength of 261 nm. In this configuration, the host crystal is VLF (very low frequency) instead of YAG. The 261 nm wavelength is not ideal for certain applications involving spectroscopic identification of molecular species. A shorter wavelength produces a better signal condition. The unique property of Praseodymium:YAG which makes it a very interesting candidate for a shorter wavelength UV laser source is a clear difference between the pump wavelength absorption line at 445 nm and the laser emission line at 488 nm. Most materials exhibit a strong overlap in these two bands which means that it is difficult or impossible to develop any laser gain due to self-absorption. By optimizing the fundamental 488 nm laser wavelength and then introducing a single frequency doubling crystal intra-cavity, a wavelength of 244 nm should be possible. Recent measurements have shown a strong laser cross section of $24.4 \times 10\text{-}20$ $cm^2$ for the 488 nm transition. This is of similar magnitude to the measured cross sections from other host materials which produce strong laser outputs at longer wavelengths.

b. UV Laser—Pr:BYF@247.5 nm and Praseodymium BYF Solid State Material Characteristics The first demonstration of a directly-pumped blue laser using a $Pr^{3+}$-doped medium took place in 1977 at the Naval Research Laboratory under the direction of Leon Esterowitz and co-workers [Est77], who demonstrated room temperature lasing of Pr:YLF at 479 nm when pumped with a 444-nm pulsed dye laser.

Recent advances in GaN diode lasers operating in the 440-nm to 450-nm range have been used to efficiently pump $Pr^{3+}$-doped fluorides (e.g. YLF was the most common) operating in the visible [Cor08, Met13,Rei12b, Str10]. To our knowledge, the only use of Pr with Barium Yttrium Fluoride (BYF) is from [Met13, Met13a] which demonstrated lasing at 495 nm using a 445-nm GaN pump diode.

While other Pr based lasers have been frequency doubled, none have been frequency doubled and resulted in a wavelength which is <250 nm. The wavelength of <250 nm is important in for Deep Ultra Violet (DUV) Raman because it results in fluorescence free Raman spectroscopy. While the Pr:YAG & Pr:BYF lasers both operate below 250 nm, the Pr:BYF is more efficient (requires less input electrical power to produce the same output power) and has several other advantages.

2. Problem Statement

As indicated above, systems and techniques of this type present a number of competing interests and factors. The properties of materials, their reaction to light energy, and even their cost and complexity to implement effectively in such applications as spectroscopy-based detection systems having an interrogation beam and reflectance collection of scattering from the beam relative the target, are but a few that both (a) produce efficient and effective laser sources, especially in molecular species identification using spectroscopy and, further, especially in Raman spectroscopy and (b) produce better signals for molecular species analysis especially in Raman spectroscopy which has challenges regarding separating relevant signal from irrelevant. This does not typically allow for predictable substitutions. Therefore, there is room for improvement in this technical state of the art.

II. SUMMARY OF THE INVENTION

A. Objects, Features, and Advantages of the Solution of the Invention

A principal object of the present invention is to provide apparatus, systems, and methods for solving problems or overcoming deficiencies in the state-of-the-art regarding optical detectors.

As will be seen by reference to the following disclosure, the solutions of the present invention provide one or more of the following benefits:

a. generation of UV laser frequencies effectively, economically, and efficiently, including for interrogation sources for spectrometers;

b. opportunities for advantageous form factors and reduced size portable instruments using such laser generation techniques;

c. a shorter wavelength initial laser source which can then be frequency doubled to UV wavelength for Raman spectrometry;

d. effective generation of UV interrogation laser for better fluorescence rejection;

e. ability to have greatly reduced background fluorescence because the laser wavelength is <250 nm;

f. combines generation of efficient and effective Pr-based laser designs with efficient and effective molecular species identification for improved systems, methods, and apparatus over the state of the art.

These and other advantages, options, and features meaningful to the invention are disclosed herein and will become more apparent with reference to the accompanying description, drawings, and claims.

B. Aspects of the Solution of the Invention

As can be appreciated by the foregoing, the competing interests and unpredictability of combination of elements in this technical area presents challenges. The inventors have innovated by combining certain elements in an efffacious manner, particularly by the insight of use of Pr:YAG and Pr:BYF lasers.

Below are the laser designer challenges and/or unique technical issues the invention addresses to get the Pr:YAG to work:

a. Pump geometry—End Pumped—The simplest design is to use end pumped configuration. While this will work, the design will be limited in the amount of output power that can be produced and Amplified Spontaneous Emission (ASE). Since this is a CW laser, the ASE can be managed by coating design which efficiently reflects the desired 488 and 244 nm wavelengths and attenuates the other wavelengths.

b. Pump geometry—Side Pumped—Utilizing this configuration allows a more powerful laser since (1) more pump laser diodes can be coupled to the Pr:YAG crystal and (2) the resonator design will allow for a double pass through the intra-cavity doubling crystal (BBO) thereby improving its efficiency.

c. Laser Self Absorption—One of the challenges with the Pr:YAG laser is that the pump wavelength and lasing wavelength are fairly close (445 and 488 nm). This means that all components of the laser design need to ensure that the 488 nm wavelength propagates efficiently in the resonator (and 244 nm since this is an intra-cavity doubled design) and that the other wavelengths are attenuated within the resonator. This means that the anti-reflection (AR) coatings of the crystal and the reflectivity of the mirrors must be designed appropriately.

i. The absorption within the Pr:YAG crystal is polarization dependent, thus the crystal orientation and coatings design will be designed to operate at the polarization state which has the largest wavelength separation between the pump (445 nm) and lasing (488 nm).

d. UV only operation—Since the Pr:YAG can lase at multiple wavelengths other than the desired 488 nm line, the mirror coatings must be non-reflective at all other wavelengths.

At least similar challenges and solutions exist relative to use of Pr:BYF based-lasers, as further discussed herein.

III. BRIEF DESCRIPTION OF THE DRAWINGS

FIG. 1. Pr:YAG Laser design—Concave-convex resonator—according to one exemplary embodiment of the invention.

FIG. 2. Pr:YAG laser design—Cross-Porro Prism Resonator concept—according to another exemplary embodiment of the invention.

Figure 3:
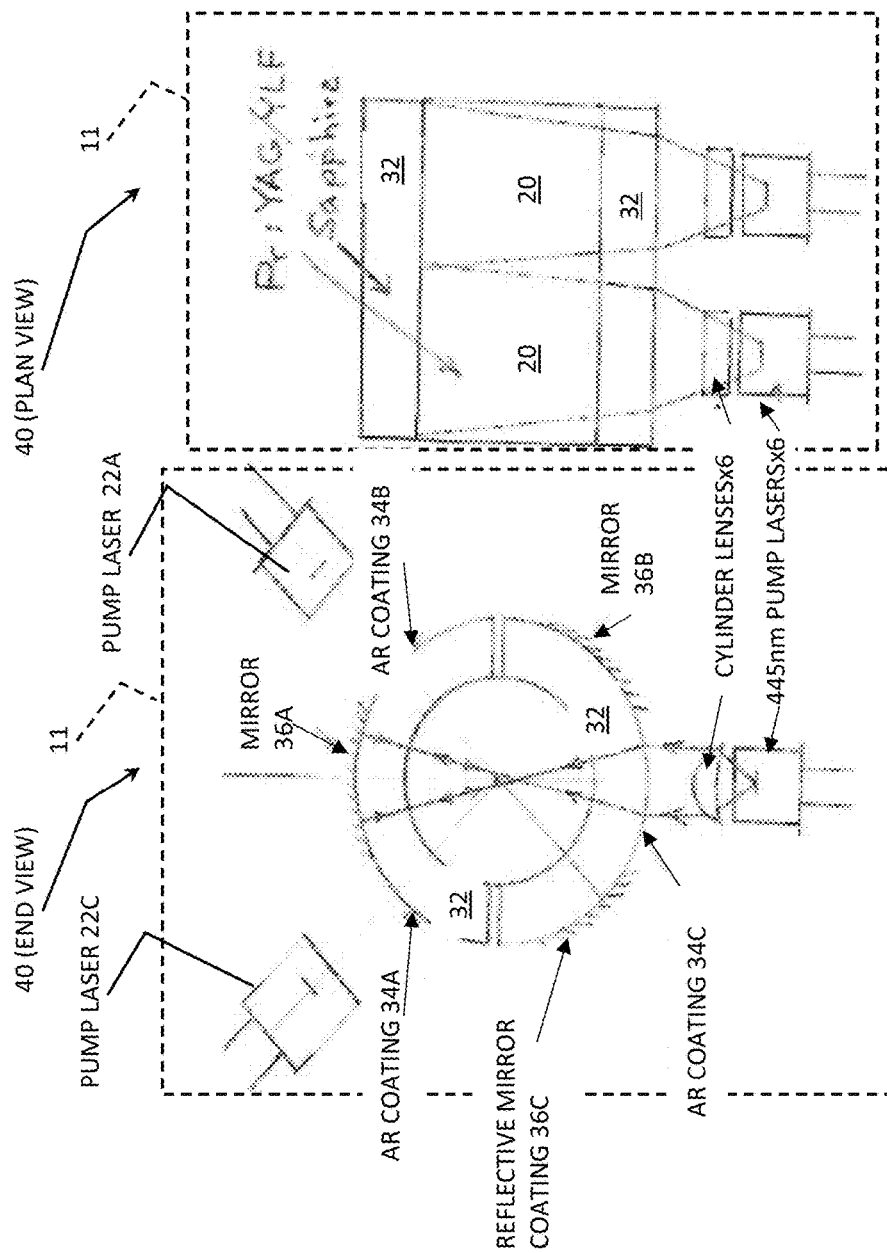

FIG. 3. Double Pass Circular Sapphire Clamp Heat Sink Resonator concept for Pr:YAG laser from Existing Literature.

FIG. 4. Embodiment of a portable UV Raman system utilizing a 244 nm Pr:YAG laser such as FIGS. 1 and 2 according to an exemplary embodiment of the invention. Size of system in this example is on the order of 8 inches×8 inches×3 inches.

Figure 5:
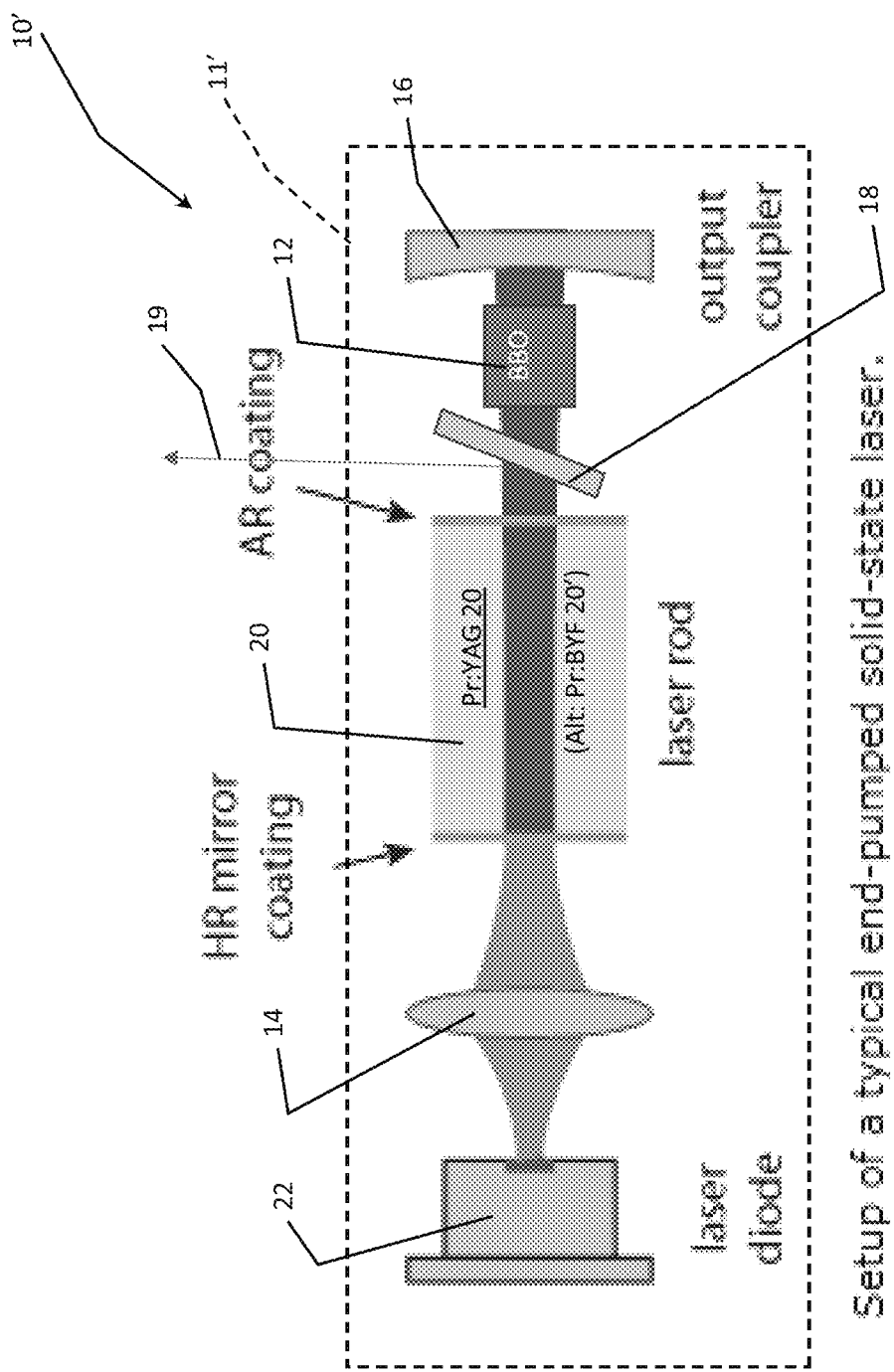

FIG. 5. An alternative embodiment similar to that of FIG. 1, but using an end-pumped laser.

FIG. 6: A graph related to a further embodiment according to aspects of the invention related to use of a Pr:BYF laser.

FIG. 7: Another graph related to a Pr:BYF laser embodiment.

FIG. 8: A graphic illustration of operation of a Pr:BYF embodiment.

FIG. 9: A further graphic illustration of operation of a Pr.BYF embodiment.

FIG. 10: A further graphic illustration of operation of a Pr.BYF embodiment.

IV. DETAILED DESCRIPTION OF EXEMPLARY EMBODIMENTS OF THE INVENTION

A. Overview

For a better understanding of the invention, some examples of forms it can take all now be described in detail. It is to be understood these are neither exclusive nor inclusive of all such forms or embodiments the invention can take.

First, several embodiments and options useable with a Raman or LIDOR sensor for chemical detection at standoff distances will be described. Variations obvious to the skill you will be included within these embodiments.

Second, an expansion of those concepts to optional features or alternatives will be described. It will be understood by those skilled in the art that these are examples only for illustration and variations obvious to those skilled in the art of course possible.

It will also be understood that the examples focus, just for purposes of simplicity, on detection of explosives such as used with IEDs (improvised explosive devices). The concept of the invention can be applied to a wide variety of chemicals, chemical compounds, and chemical constituents, as is well known in Raman- or LIDOR-based spectroscopy. Form factor and characteristics of the components, as well as the parameters to control them, will, of course, also vary according to need or desire.

B. UV Generation Using Intra-Cavity Frequency Doubling

This aspect of the present invention is now described with reference to FIGS. 1 and 2. FIGS. 1 and 2 present non-limiting examples of optimizing the fundamental (e.g. 488 nm) laser wavelength and then introducing a single frequency doubling crystal intra-cavity (e.g. making a wavelength of 244 nm possible).

System 10 of FIG. 1 operates as follows.

Strong continuous output UV at a wavelength of 244 nm should be possible by the introduction of a second harmonic non-linear crystal 12 into the resonator 11 previously optimized for the 488 nm oscillation. The non-linear crystal of choice for this wavelength range and for continuous operation is BBO. BBO is widely used for second harmonic generation to the UV both extra-cavity and intra-cavity. BBO is a well-known crystal and is available from many sources. BBO crystal has both high transmission and is impervious to color center formation by the UV energy.

BBO crystal also has a high damage threshold, good thermal properties for high average power operation.

Laser generation with pumping laser diodes and frequency multipliers is well-known. Further details for background can be found at least at US 20130293882 A1 (stand off distance Raman detection and an example of a standoff distance Raman-based spectrometer for chemical detection); U.S. Pat. No. 6,327,281 (BBO-based frequency multiplier resonator and an example of a BBO based laser resonator); U.S. Pat. No. 8,125,627 (a different UV laser and an example of IR visible UV lasers), each of the foregoing incorporated by reference herein in its entirety.

C. Resonator Concepts and Description Regarding Pr:YAG Laser

The arrangement within the cavity 11 is as shown in FIG. 1. A polarizer P1 is introduced into the cavity to assure a highly polarized beam in the frequency doubling leg. The polarizer P1 serves the dual purpose of polarizing the circulating fundamental wavelength and also as the output coupling means for the UV (see "UV Output 19"). This arrangement 11 allows a second pass through the BBO crystal to optimize the UV generation. After the second pass through the BBO crystal 12, the UV component is reflected by the plate polarizer P1 and becomes the "UV output" beam 19 from the resonator 11. The remainder of the 488 nm fundamental passes through the polarizer P1 and returns to the Pr:YAG crystal 20.

The resonator may be terminated with conventional mirrors M1 and M2 with dielectric coatings. The resonator 11 geometry will employ a concave-convex resonator design which will maximize the mode volume and therefore the circulating power of the oscillating fundamental wavelength. This resonator geometry is very stable over environmental changes in temperature and slight structural misalignments.

As is well-known to those skilled in this technical area, the resonator 11 of FIG. 1 is basically an an arrangement of mirrors that forms a standing wave cavity resonator for light waves. Optical cavities are a major component of lasers, surrounding the gain medium and providing feedback of the laser light. Details regarding the basic optical resonator configuration and operation can be found at U.S. Pat. No. 6,327,281, which is incorporated by reference herein. Its end mirrors M1 and M2, housing, and other conventional components are commercially available. Here M1 is concave and M2 convex at facing, functional surfaces.

In this embodiment, the laser 14 comprises a Pr:YAG laser with four pump diodes 15 at 445 nm each. This produces the 488 visible light oscillation from this lasing medium.

BBO 16 is a specific optical-grade crystal and commercially available. One example is at U.S. Pat. No. 6,327,281 which is incorporated by reference herein.

Polarizer P1 is commercially available and functions as explained above.

The above combination can be configured to produce a desired UV output 19 as discussed above. The beneficial aspects are as outlined above.

1. Alternate Designs:

One non-limiting alternative to FIG. 1 is diagrammatically illustrated at FIG. 2. A Pr:YAG laser source, its pump diodes, and the BBO crystal can be similar to 20, 22, and 12 of FIG. 1. The main differences are highlighted below.

1. Cross-Porro Design 30: This design 30 employs retro-reflecting porro prisms and the end elements 24 and 26 (FIG. 2). Porro prisms oriented with crossed roof lines are a very stable optical configuration. Arrangement 30 produces a similar result as system 10 of FIG. 1 but with this different set-up. The fundamental concepts of cross-porro arrangements can be seen at U.S. Pat. No. 5,199,042 (an example of a cross-porro prism resonator), incorporated by reference herein.

2. Double Pass Axial Configuration 40: This design 40 employs 6 pump diodes 22 (instead of four in FIGS. 1 and 2) arranged using a sapphire circular clamp heatsink 32 as shown in FIG. 3. This design results in a double pass configuration for high power. In addition, the sapphire circular clamp heatsinks 32 results in the ability to keep the Pr:YAG rod 20 at lower temperatures thereby improving performance at the higher output powers.

As shown in FIG. 3, this embodiment uses a different resonator cavity (double pass) using semi-cylinder sapphire shapes. One example of a sapphire heat sink resonator is at U.S. Pat. No. 5,317,585 (an example of a sapphire-based heat sink used in a laser resonator), incorporated by reference herein. The lasing medium however is Pr:YAG. FIG. 3 shows one way to set up resonance in the cavity, including mirrored sectors 36A-C and each associated diode pump 22A-C) including cylinder lenses 23A-C) (diagrammatic depiction of two-way reflection between just one pump 22B and one mirrored sector 36B is shown for simplicity). Frequency doubling is achieved by intracavity doubling using a BBO Harmonic Conversion crystal (as previously described).

3. Simple Co-Linear Design: This design 10' (FIG. 5) employs an end pumped (diode(s) 22) resonator 11' with an intra-cavity doubling crystal 12 all resulting in a co-linear design. This design will have less output power then the other designs but may be sufficient for some applications. See FIG. 5. See, e.g., U.S. Pat. No. 5,446,749, an example of a doubling crystal and end pumped resonator and incorporated by reference herein.

To our knowledge nobody has fabricated a Pr:YAG laser in this manner despite the following:

There is a published article on the material properties of the Pr: YAG crystal:

Wenpeng Liu & Qingli Zhang (2017) Growth and spectral properties of Pr3+-doped Y3Al5O12 crystal for potential use in all-solid state visible laser, Materials Research Innovations, 21:2, 65-68, DOI: 10.1080/14328917.2016. 1 183334; an example of growth and spectral properties of Pr3+-doped Y3Al5O12 crystal for potential use in all-solid state visible laser, and incorporated by reference herein.

There is published info on PR: YLF lasers:

Vasiliy Ostroumov, Wolf Seelert, Lukas Hunziker, Chris Ihli, "522/261 nm cw generation of Pr:YLF laser pumped by OPS laser"\ Proc. SPIE 6451, Solid State Lasers XVI: Technology and Devices, 645104 (8 Feb. 2007), an example of a 522/261 nm cw generation of Pr:YLF laser pumped by OPS laser, and incorporated by reference herein.

psi.fuw.edu.pl/pub/lPWb/Lasery/ALKAAD_PrYLF_Laser.pdf, another example and incorporated by reference herein.

There is published patent literature on a Pr-doped optical fiber, and an example of a discussion of a Praseodymium laser, see e.g., U.S. Pat. No. 5,309,452 incorporated by reference herein.

2. UV Raman Systems

Another aspect of the invention is illustrated at FIG. 4.

Most UV Raman systems are rather. Large (>1 cu ft) (see CPEDS™ and PRIED™ systems (available commercially from Alakai Defense Systems, Inc., Largo, Fla. (USA) with product descriptions at https://docs.wixstatic.com/ugd/ 3e1446_cf8257f776944296b3dbe6f6302e260e.pdf and https://docs.wixstatic.com/ugd/ 3e1446_b9e1071632114fb3b23bdc0ccb9546a1.pdf respectively, and see also US 20130293882 A1 for details; all incorporated by reference herein). Most small portable Raman systems utilize non-UV wavelength lasers (typically 532, 785 nm or 1064 nm).

FIG. 4 show a first embodiment according to aspects of the invention of a 245 nm laser (e.g. as discussed above) into a handheld UV Raman system 100. In this system 100, the transmitted light is generated by the 244 Pr:YAG laser 50. Its output is folded to be collinear with the collection beam (collected by collection optics 102) by the edge filter 107 (See U.S. Pat. No. 7,123,416, for an example of edge filters and incorporated by reference herein). The transmit beam is then sent out of the system 100 and the operator points it at the desired target (at stand off distance, not shown). The range finder 108 determines the range to the target and then adjust the focus of the main collection optics 102. The return beam is collected by the collection optics 102. The edge filter 107 then sends only the Raman shift light to the spectrometer 104. The processor 106 (via PCB 105) reads the output and then utilizing a proprietary algorithm determines the chemical that are present at the sample (at the target). The results are communicated to the main interface device (not shown and could be remote and/or wireless) (e.g. an Android or iPhone not shown). This embodiment can beneficially be packages in relatively small, more portable form factor and weight than typical UV Raman systems, yet its unique combination achieves at least one or more of the objects, features, or advantages described herein, including but not limited to an efficient and effective technique to generate the proper interrogation lasers to promote improved signal for molecular species identification, including with Raman spectroscopy.

Alternative embodiments (non-limiting) could include:
1. the collection optics can use either:
   a. a collinear design as shown in FIG. 4; or
   b. a non-collinear design using off-axis spherical or aspherical optics.
2. the range finder could be any of the following:
   a. a standard time-of-flight laser range finder;
   b. utilize a linear array in a laser triangulation implementation;
   c. an auto-focus range estimator;
   d. other.
3. the angles between the transmit axis and the receive axis could be:
   a. roughly perpendicular as shown;
   b. roughly parallel.
4. the coupling between the collection optics and spectrometer could be:
   a. direct optical couples as shown;
   b. utilize an optical fiber which could be a single fiber or a multi-element fiber array.
5. the user interface could take a variety of configurations.

D. UV Laser—Pr:BYF@247.5 nm

Another aspect of the invention utilizes a Pr:BYF-based UV laser (see reference number 20' in FIGS. 8-10). It can be implemented in similar operational configurations as discussed above regarding systems using a Pr:YAG-based laser (reference number 20 in FIGS. 1-5), so reference can be also be taken to FIGS. 1-5 and the foregoing description regarding such details. However, with reference to FIGS. 6-10, aspects of Pr:BYF-based UV lasers and use in UV Raman systems are discussed below.

1. Praseodymium BYF Solid State Material Characteristics

The first demonstration of a directly-pumped blue laser using a $Pr^{3+}$-doped medium took place in 1977 at the Naval Research Laboratory under the direction of Leon Esterowitz and co-workers [Est77 at list of References infra], who demonstrated room temperature lasing of Pr:YLF at 479 nm when pumped with a 444-nm pulsed dye laser. Recent advances in GaN diode lasers operating in the 440-nm to 450-nm range have been used to efficiently pump $Pr^{3+}$-doped fluorides (e.g. YLF was the most common) operating in the visible [Cor08, Met13,Rei12b, Str10]. To our knowledge, the only use of Pr with Barium Yttrium Fluoride (BYF) is from [Met13, Met13a] which demonstrated lasing at 495 nm using a 445-nm GaN pump diode.

While other Pr based lasers have been frequency doubled, none have been frequency doubled and resulted in a wavelength which is <250 nm. The wavelength of <250 nm is important in for Deep Ultra Violet (DUV) Raman because it results in fluorescence free Raman spectroscopy. While the Pr:YAG & Pr:BYF lasers both operate below 250 nm, the Pr:BYF is more efficient (requires less input electrical power to produce the same output power) and has several other advantages.

2. UV Generation Using Intra-Cavity Frequency Doubling

Strong continuous output UV at a wavelength of 247.5 nm should be possible by the introduction of a second harmonic non-linear crystal into the resonator previously optimized for the 495 nm oscillation. The non-linear crystal of choice for this wavelength range and for continuous operation is BBO. BBO is widely used for second harmonic generation to the UV both extra-cavity and intra-cavity. BBO is a well-known crystal and is available from many sources. BBO has both high transmission and is impervious to color center formation by the UV energy. BBO also has a high damage threshold, good thermal properties for high average power operation. FIGS. 6 and 7 show the results of LASCAD modeling which indicate sufficient laser output power (~100 mW) of the Second harmonic (SH) laser beam which is at 247.5 nm.

3. Resonator Concepts and Description

Two arrangements of a simple resonator cavity are shown in FIGS. 8 and 9. Both of these designs utilize a single pumping laser diode. The configuration of FIG. 8 utilizes a folded resonator design which will be easier to align since it is a little larger package. FIG. 9 shows a linear design which results in a physically smaller more compact laser but may be more problematic to align. In both cases of these examples of a Pr:BYF-based system, there are two Second Harmonic (SH) beam generated (247.5 nm). If sufficient power is achieved with one beam then the second beam can be ignored. However if more power is required, then this second beam can be combined with the original beam with classical lenses and mirrors to form a single beam.

The resonator may be terminated with conventional mirrors with dielectric coatings. The resonator geometry will employ a concave-concave resonator design which will maximize the mode volume and therefore the circulating power of the oscillating fundamental wavelength. This resonator geometry is very stable over environmental changes in temperature and slight structural misalignments.

Alternate resonator designs:

1. Two pump sources: FIG. 10 shows a resonator design which supports two pump diodes in case additional power is required.

The following concepts refer to figures which show a Pr:YAG crystal however the concepts will work for Pr:BYF also:

2. Cross-Porro Design: This design employs retro-reflecting porro prisms and the end elements (see, e.g., FIG. 2). Porro prisms oriented with crossed roof lines are a very stable optical configuration.

3. Double Pass Axial Configuration: This design employs six pump diodes arranged using a sapphire circular clamp heatsink as shown in FIG. 3. This design results in a double pass configuration for high power. In addition the sapphire circular clamp heatsinks results in the ability to keep the Pr:BYF rod at lower temperatures thereby improving performance at the higher output powers.

REFERENCES (EACH INCORPORATED BY REFERENCE HEREIN)

[Cor08] F. Cornacchia, A Di Lieto, M. Tonelli, A. Richter, E. Heumann, and G. Huber, "Efficient visible laser emission of GaN laser diode pumped Pr-doped fluoride scheelite crystals," Opt. Express, 16, (2008), 15932.

[Met13] P. Metz, D. Parisi, K. Hasse, N. Hansen, C. Kränkel, M. Tonelli, and G. Huber, "Room temperature cyan $Pr^{3+}$:$BaY_2F_8$ laser at 495 nm," in *Advanced Solid-State Lasers Congress*, G. Huber and P. Moulton, eds., OSA Technical Digest (online) (Optical Society of America, 2013), paper AF2A.

[Met13a] P. Metz, K. Hasse, D. Parisi, N. O. Hansen, C. Kränkel, M. Tonelli, and G. Huber, "Continuous-wave $Pr^{3+}$:$BaY_2F_8$ and $Pr^{3+}$:$LiYF_4$ lasers in the cyan-blue spectral region," Optics lets., 39, 5158, (2013).

[Rie14] R. Riedal et al., "Thermal properties of borate crystals for high power optical parametric chirped-pulse amplification," Opt. Express, 22, 17607, (2014).

[Str10] M. Strotkamp, T. Schwarz, B. Jungbluth, H. Faidel, and M. Leers, "Efficient, green laser based on a blue-diode pumped rare-earth-doped fluoride crystal in an extremely short resonator," Proc. SPIE., 7578, (2010), 7578-24.

E. Options and Alternatives

As will be appreciated by those having skill in this technical art, options and alternatives to the foregoing exemplary embodiments are of course possible. Variations obvious to those skill to be included within the invention which is not limited by the embodiments disclosed herein. Some additional examples of options and alternatives are as follows.

1. Form Factor

As indicated above, the form factor of each of the components can vary according to need or desire. Portability can be approximately less than a fraction of a meter in all dimensions for housing 101 in FIG. 4.

2. Control System

Components necessary to allow inter-communication between electrical/electronic functions of the system can be selected and configured in a variety of ways according to the designer's needs and desires. This could include some type of programmable processor or controller.

3. Adjustability

Both factory settings and subsequent adjustments of operation of the system can be easily accomplished by programming and programming of a microprocessor or other intelligent control, including any number of factors, parameters, and the like according to the designer's need or desire. Such programming is well-known.

What is claimed is:

1. A compact solid state laser for generating a UV laser for effective and efficient molecular species identification with Raman spectroscopy comprising:
   a. a resonator cavity having a main intra-cavity optical path;
   b. a pumped Pr:BYF lasing medium along the main intra-cavity optical path configured to directly generate a laser with an emission line resonating in shorter wavelengths of the-visible light spectrum;
   c. a single frequency doubling crystal along the main intra-cavity optical path configured to convert the visible light oscillation to UV oscillation at <250 nm, including deep ultraviolet (DUV) for fluorescence free Raman spectroscopy;
   d. an optical component along the main intra-cavity optical path configured to direct the UV oscillation of the single frequency doubling crystal out of the resonator cavity for extra-cavity UV laser output for use in a Raman spectrometry detection scheme.

2. The solid state laser of claim 1 wherein the at least one laser pump diode is/are in one of:
   a. an end-pumped axial arrangement; or
   b. a transaxial arrangement.

3. The solid state laser of claim 1 wherein the resonator cavity comprises a concave-convex resonator.

4. The solid state laser of claim 1 wherein the resonator cavity comprises a cross-porro prism resonator.

5. The solid state laser of claim 1 wherein the resonator cavity comprises a double-pass axial concentrator resonator.

6. The solid state laser of claim 5 wherein the double-pass axial concentrator resonator comprises a conductive sapphire heat sink.

7. The solid state laser of claim 1 wherein the optical component for the output laser comprises a dichroic filter.

8. The solid state laser of claim 7 wherein the dichroic filter further comprises a polarizer.

9. The solid state laser of claim 1 further comprising a component which reflects relevant wavelengths of light and attenuates irrelevant wavelengths, wherein the component comprises at least one of:
   a. an optical coating;
   b. ASE; and
   c. AR coating.

10. The solid state laser of claim 1 in combination with a UV Raman system comprising:
    a. a hand-held housing;
    b. an on-board power source;
    c. a processor and circuit;
    d. collection optics;
    e. a Raman spectrometer; and
    f. a range finder.

11. The solid state laser of claim 1 wherein:
    a. the Pr:BYF pumped lasing medium comprises:
       i. at least one pumping laser diode;
       ii. adapted to create a visible light oscillation; and
    b. the single doubling crystal comprises a BBO harmonic conversion crystal adapted to convert the visible light oscillation to UV oscillation.

12. The solid state laser of claim 11 wherein the solid state laser is with the at least one pumping laser diode and:

a. the visible light oscillation is at 495 nm;
b. the UV oscillation is at 247.5 nm.

13. The solid state laser of claim 12 wherein the at least one pumping laser diode comprises:
   a. one pumping laser diode; or
   b. more than one pumping laser diode.

14. The solid state laser of claim 11 wherein the resonator comprises a folded resonator design with two pump laser diodes.

15. The solid state laser of claim 11 wherein the resonator comprises a linear resonator design.

16. The solid state laser of claim 11 wherein the resonator cavity comprises a cross-porro prism resonator.

17. The solid state laser of claim 11 wherein the resonator cavity comprises a double-pass axial concentrator resonator.

18. The solid state laser of claim 11 in combination with a UV Raman system comprising:
   a. a hand-held housing;
   b. an on-board power source;
   c. a processor and circuit;
   d. collection optics;
   e. a spectrometer; and
   f. a range finder.

19. A method of creating a UV laser for use in Raman-based spectroscopy detection for effective and efficient molecular species identification with Raman spectroscopy comprising:
   a. generating a UV laser by:
      i. generating directly an optimized oscillation in shorter wavelengths of the visible spectrum using pumped Pr:BYF in the visible light spectrum at 400-600 nm as the lasing medium; and
      ii. frequency doubling the optimized oscillation with a single frequency doubling crystal into the UV spectrum at <250 nm; and
   b. using the UV oscillation for fluorescence free Raman-based spectroscopy detection.

20. The method of claim 19 wherein the UV laser generation is in a resonator cavity comprising:
   a. a concave-convex arrangement;
   b. a cross-porro prism arrangement; or
   c. a double pass concentrator with sapphire heat sink arrangement.

21. The method of claim 19 wherein the optimized visible spectrum oscillation is generated by:
   a. pumping the pumped Pr:BYF with laser diodes at 495 nm;
   b. producing 147.5 nm oscillation.

22. The method of claim 21 wherein the frequency doubling is through a BBO crystal.

23. The method of claim 21 wherein the UV laser generation is in a resonator cavity comprising:
   a. a concave-convex arrangement;
   b. a cross-porro prism arrangement; or
   c. a double pass concentrator with sapphire heat sink arrangement.

24. The method of claim 19 contained with a hand-held sized portable housing including:
   a. directing the UV laser output to a target;
   b. collecting reflectance from the target;
   c. analyzing the reflectance with Raman spectroscopy; and
   d. generating a notification or indicator based on the spectroscopy.

25. The method of claim 19 used for stand-off distance chemical/molecular species detection.

26. The method of claim 25 wherein the notification or indicator relates to detection of chemical/molecular species detection of an explosive.

27. A portable UV Raman system for effective and efficient molecular species identification with Raman spectroscopy from a target at stand-off distances comprising:
   a. a hand-held portable housing;
   b. a battery;
   c. a laser source in the housing for stand-off distance interrogation of a target;
   d. a collection optics in the housing for collecting Raman scattering from the interrogated target;
   e. a spectrometer in the housing capable of Raman scattering detection;
   f. a processor and circuit for controlling operation of the system and processing the collected Raman scattering;
   g. the laser source comprising
      i. a pumped Pr:BYF lasing medium in a resonator cavity configured to directly generate a laser within shorter wavelengths of the visible light spectrum;
      ii. a single frequency doubling crystal configured to convert the generated visible light oscillation to UV oscillation at <250 nm; and
      iii. an optical component configured to direct the UV oscillation out of the cavity for extra-cavity UV laser output for interrogation of the target.

28. The system of claim 27 wherein:
a. the visible spectrum oscillation is at 488 nm;
b. the UV oscillation is at 244 nm.

29. The system of claim 27 wherein:
a. the visible spectrum oscillation is at 495 nm;
b. the UV oscillation is at 247.5 nm.

30. The system of claim 27 applied to Deep Ultraviolet Raman detection.

* * * * *